US009265161B2

(12) United States Patent
Ahn et al.

(10) Patent No.: US 9,265,161 B2
(45) Date of Patent: Feb. 16, 2016

(54) METHOD OF MANUFACTURING AN EMBEDDED PRINTED CIRCUIT BOARD

(75) Inventors: Chi Hee Ahn, Seoul (KR); Sang Myung Lee, Seoul (KR); Yeong Uk Seo, Seoul (KR); Jin Su Kim, Seoul (KR); Sung Woon Yoon, Seoul (KR); Myoung Hwa Nam, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 236 days.

(21) Appl. No.: 12/956,545

(22) Filed: Nov. 30, 2010

(65) Prior Publication Data

US 2011/0127070 A1 Jun. 2, 2011

(30) Foreign Application Priority Data

Nov. 30, 2009 (KR) .................. 10-2009-0116879

(51) Int. Cl.
*H05K 3/02* (2006.01)
*H05K 3/10* (2006.01)
(Continued)

(52) U.S. Cl.
CPC .............. *H05K 3/465* (2013.01); *H05K 3/107* (2013.01); *H05K 3/184* (2013.01); *H05K 3/0032* (2013.01); *H05K 3/045* (2013.01); *H05K 3/4661* (2013.01);
(Continued)

(58) Field of Classification Search
CPC ............... H01L 2224/16; H01L 2224/16225; H01L 23/4985; H01L 2924/15311; H01L 21/76832; H01L 2224/03; H01L 24/11; H01L 21/4857; H01L 2924/1517; H05K 2201/0367; H05K 2203/0733; H05K 3/0035; H05K 3/205; H05K 3/4007; H05K 3/107; H05K 3/465; H05K 3/4644; Y10T 29/49155; Y10T 29/49124; Y10T 29/49117

USPC ........ 29/846, 825, 829, 848, 852; 216/11, 13, 216/18, 38, 49, 52; 427/98.5, 555
See application file for complete search history.

(56) References Cited

U.S. PATENT DOCUMENTS 8,075,788 B2 12/2011 Arai et al.
2009/0000813 A1 1/2009 Hsu
(Continued)

FOREIGN PATENT DOCUMENTS

CN H07-240568 A 9/1995
CN 101198219 A 6/2008
(Continued)

OTHER PUBLICATIONS

Office Action dated Mar. 5, 2014 in Chinese Application No. 2010-10588017.5, filed Nov. 30, 2011.

*Primary Examiner* — Thiem Phan
(74) *Attorney, Agent, or Firm* — Saliwanchik, Lloyd & Eisenschenk

(57) ABSTRACT

An embedded PCB, a multi-layer PCB using the embedded PCB, and a method of manufacturing the same are provided. The method of manufacturing an embedded PCB includes a first step of patterning an insulating layer on which a photoresist layer is formed using a laser such that parts of the insulating layer are selectively etched to form a circuit pattern region and a second step of filling the circuit pattern region with a plating material to form a circuit pattern. Accordingly, the method of manufacturing an embedded PCB can simultaneously or sequentially etch a photoresist layer and an insulating layer using a laser to form a circuit pattern so as to obtain a micro pattern and simplify a manufacturing process and achieve alignment accuracy in construction of a multi-layer PCB using the embedded PCB to thereby improve product reliability and yield.

5 Claims, 8 Drawing Sheets

(51) Int. Cl.
  *H05K 3/46*  (2006.01)
  *H05K 3/18*  (2006.01)
  *H05K 3/00*  (2006.01)
  *H05K 3/04*  (2006.01)

(52) U.S. Cl.
  CPC ..... *H05K 2203/054* (2013.01); *Y10T 29/49124* (2015.01); *Y10T 29/49155* (2015.01)

(56) References Cited

U.S. PATENT DOCUMENTS

2009/0190879 A1  7/2009  Hikita et al.
2012/0073865 A1  3/2012  Kang et al.

FOREIGN PATENT DOCUMENTS

| | | |
|---|---|---|
| CN | 101493547 A | 7/2009 |
| EP | 1482772 A2 | 12/2004 |
| JP | 2001-036200 A | 2/2001 |
| JP | 2008-166736 A | 7/2008 |
| KR | 10-0857165 B1 | 9/2008 |
| KR | 10-2008-0096985 A | 11/2008 |
| KR | 10-2009-0022737 A | 3/2009 |
| TW | 200726355 | 7/2007 |
| TW | 201019808 | 5/2010 |

METHOD OF MANUFACTURING AN EMBEDDED PRINTED CIRCUIT BOARD

CROSS-REFERENCE TO RELATED APPLICATION

This application claims the benefit under 35 U.S.C. §119 of Korean Patent Application No. 10-2009-0116879, filed Nov. 30, 2009, which is hereby incorporated by reference in their entirety.

BACKGROUND OF THE DISCLOSURE

1. Field of the Invention

The present invention relates to a method of manufacturing a printed circuit board (PCB) and a PCB structure manufactured by the method.

2. Discussion of the Related Art

A PCB, obtained by printing a circuit line pattern on an electrically insulating substrate using a conductive material such as copper, refers to a board before electronic components are mounted thereon. That is, the PCB is a circuit board that defines mounting positions of various electronic components and fixes a line pattern, printed thereon, for connecting the components such that the various electronic components are mounted on the board.

Methods of manufacturing the PCB use photolithography that has advantages of high productivity and low manufacturing cost. Methods of manufacturing the PCB board using photolithography include a subtractive process, a full additive process, and a semi-additive process. Particularly, the semi-additive process draws attraction since it can form a micro circuit pattern.

Referring to FIG. 1, the subtractive process forms a metal layer 2 on an insulating layer 1 (a), coats photoresist 3 on the metal layer 2, patterns the photoresist layer 3 through exposure and development (b), etches the metal layer 2 to form a circuit pattern (c), and removes the photoresist (d).

Referring to FIG. 2, the semi-additive process forms a seed layer 5 on an insulating layer 1 (a), forms a photoresist pattern 3 on the seed layer 5 (b), fills a metal material in the photoresist pattern 3 to form a circuit pattern (c), removes the photoresist pattern (d), and eliminates the seed layer 5 (e).

However, the above conventional processes are difficult to secure reliability in micro circuits because of a variation in patterns during photolithography and adhesion of materials in the micro circuits.

With the recent high integration of semiconductor chips and increase in a signal transfer rate, circuit miniaturization and PCB technology for achieving high electrical property, high reliability and high functionality are required. Accordingly, an embedded PCB having a circuit pattern embedded in an insulator, as shown in FIG. 3, is considered.

Referring to FIG. 3, a conventional method of manufacturing an embedded PCB includes a step (a) of preparing a carrier substrate having a metal layer 20 and an insulating layer 10 supporting the metal layer 20, a step (b) of coating photoresist on the metal layer 20 and patterning the photoresist to form a photoresist pattern 30, a step (c) of filling the photoresist pattern 30 with a metal material 40, a step (d) of removing the photoresist pattern to form a circuit pattern, a step (e) of aligning the carrier substrate on an insulating layer 50 with the circuit pattern 40 facing the insulating layer 50, a step (f) of pressing the carrier substrate against the insulating layer 50 using a press to embed the circuit pattern in the insulating layer 50, a step (g) of removing the metal layer, and a step (h) of removing the insulating layer.

However, the above conventional method of manufacturing an embedded PCB is complicated and it is difficult to perform interlayer alignment for embedding the circuit pattern in the insulating layer. Accordingly, there is a limitation in manufacturing a multi-layer PCB using a conventional manufacturing method.

BRIEF SUMMARY

It is an object of the present invention to provide a method of manufacturing an embedded PCB, which simultaneously or sequentially etches a photoresist layer and an insulating layer using a laser to form a circuit pattern so as to obtain a micro pattern and simplify a manufacturing process and which achieves alignment accuracy in construction of a multi-layer PCB using the embedded PCB to thereby improve product reliability and yield, and a PCB manufactured by the method.

According to an aspect of the present invention, a method of manufacturing an embedded printed circuit board (PCB) comprises a first step of patterning an insulating layer on which a photoresist layer is formed using a laser such that parts of the insulating layer are selectively etched to form a circuit pattern region; and a second step of filling the circuit pattern region with a plating material to form a circuit pattern.

The circuit pattern region may be formed by selectively etching the photoresist layer by the entire thickness thereof and selectively etching the insulating layer by a predetermined thickness to form a concave pattern.

The circuit pattern region may be formed by sequentially or simultaneously etching the photoresist layer and the insulating layer.

The second step may comprise a step of forming a metal seed layer on the insulating layer in which the circuit pattern region is formed; and a step of filling the circuit pattern region with a metal material.

The metal seed layer may be formed of one or at least two of Cu, Au, Ni, Pd, In, Ti and Sn, or a conductive polymer. The metal material may include at least one of Cu, Ag, Sn, Au, Ni and Pd.

The circuit pattern region may be filled with the metal material using one of electroless plating, electroplating, screen printing, sputtering, evaporation, ink jetting and dispensing or a combination thereof.

The method may further comprise a third step of removing the metal seed layer on the circuit pattern and the photoresist layer. The third step may comprise a step of grinding the top face of the circuit pattern before the photoresist layer is removed.

The insulating layer may be composed of a carrier layer and an insulating member formed thereon.

A method of manufacturing a multi-layer PCB aligns an inner circuit board including an insulating layer and a circuit pattern formed on the top face and/or bottom face of the insulating layer with an embedded PCB having a circuit pattern partially embedded in an insulating layer, which is manufactured through the above manufacturing method, and laminates the inner circuit board and the embedded PCB.

The circuit pattern is formed on the top and bottom faces of the inner circuit board, the circuit pattern of the embedded PCB may be aligned with the top and bottom faces of the inner circuit board and the embedded PCB may be laminated on the inner circuit board.

According to another aspect of the present invention, a method of manufacturing an embedded PCB comprises an eleventh step of forming an insulating layer on an inner circuit board composed of an insulating layer and a circuit pattern formed on the top face and/or bottom face of the insulating layer; a twelfth step of forming a photoresist layer on the insulating layer and patterning the photoresist layer such that parts of the insulating layer are selectively etched to form a circuit pattern region; and a thirteenth step of filling the circuit pattern region with a plating material.

The circuit pattern region may be formed by selectively etching the photoresist layer by the entire thickness thereof and selectively etching the insulating layer by a predetermined thickness to form a concave pattern. The circuit pattern region may be formed through laser processing.

An embedded PCB manufactured by the aforementioned manufacturing method according to the present invention comprises a circuit pattern formed on an insulating layer, wherein parts of the circuit pattern are embedded in the insulating layer. The circuit pattern may be formed of at least one of Cu, Ag, Sn, Au, Ni and Pd.

The embedded PCB may further comprise a metal seed layer formed on the side and bottom face of the circuit pattern other than the top face of the circuit pattern. The metal seed layer may be formed of one or at least two of Cu, Au, Ni, Pd, In, Ti and Sn, or a conductive polymer.

A multi-layer PCB manufactured using the above embedded PCB comprises an inner circuit board including a first circuit pattern formed on the top or bottom face of an insulating layer; and an outer circuit board laminated on the top or bottom face of the inner circuit board, wherein a second circuit pattern formed on the outer circuit board is formed on a second insulating layer such that parts of the second circuit pattern are embedded in the second insulating layer. The first and second circuit patterns may be formed of at least one of Cu, Ag, Sn, Au, Ni and Pd.

The multi-layer PCB may further comprise a metal seed layer formed on the side and bottom face of the second circuit pattern other than the top face of the second circuit pattern. The metal seed layer may be formed of one or at least two of Cu, Au, Ni, Pd, In, Ti and Sn, or a conductive polymer.

According to the present invention, the method of manufacturing an embedded PCB can simultaneously or sequentially etch a photoresist layer and an insulating layer using a laser to form a circuit pattern so as to obtain a micro pattern and simplify a manufacturing process and achieve alignment accuracy in construction of a multi-layer PCB using the embedded PCB to thereby improve product reliability and yield.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
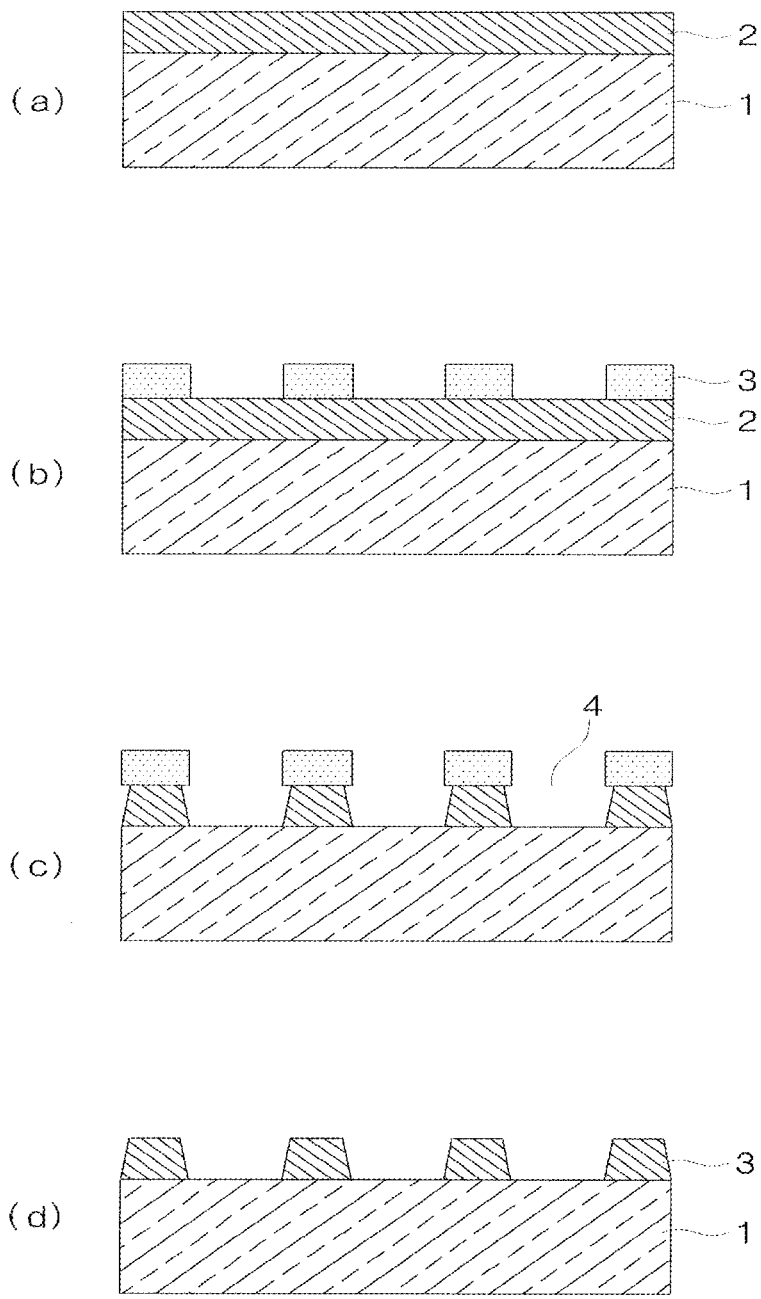
FIGS. 1, 2 and 3 are cross-sectional views showing conventional methods of manufacturing a printed circuit board (PCB)
Figure 2:
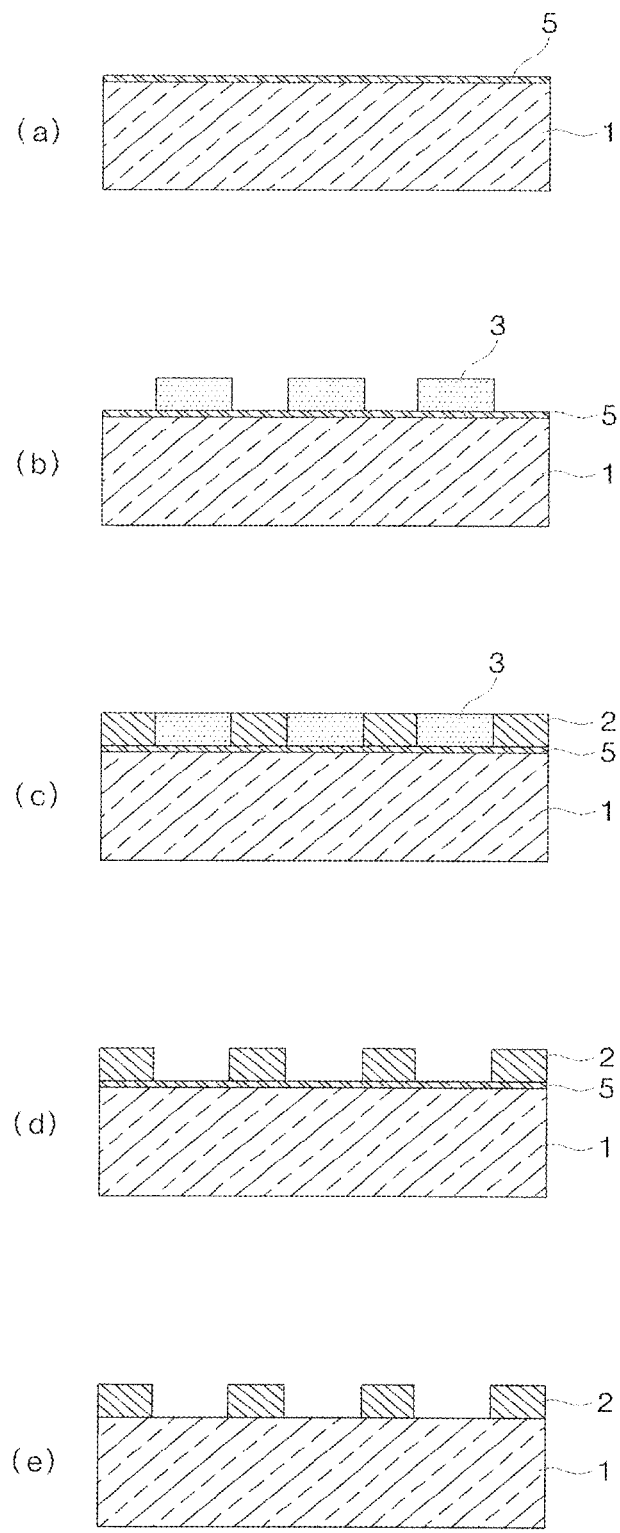
Figure 3:
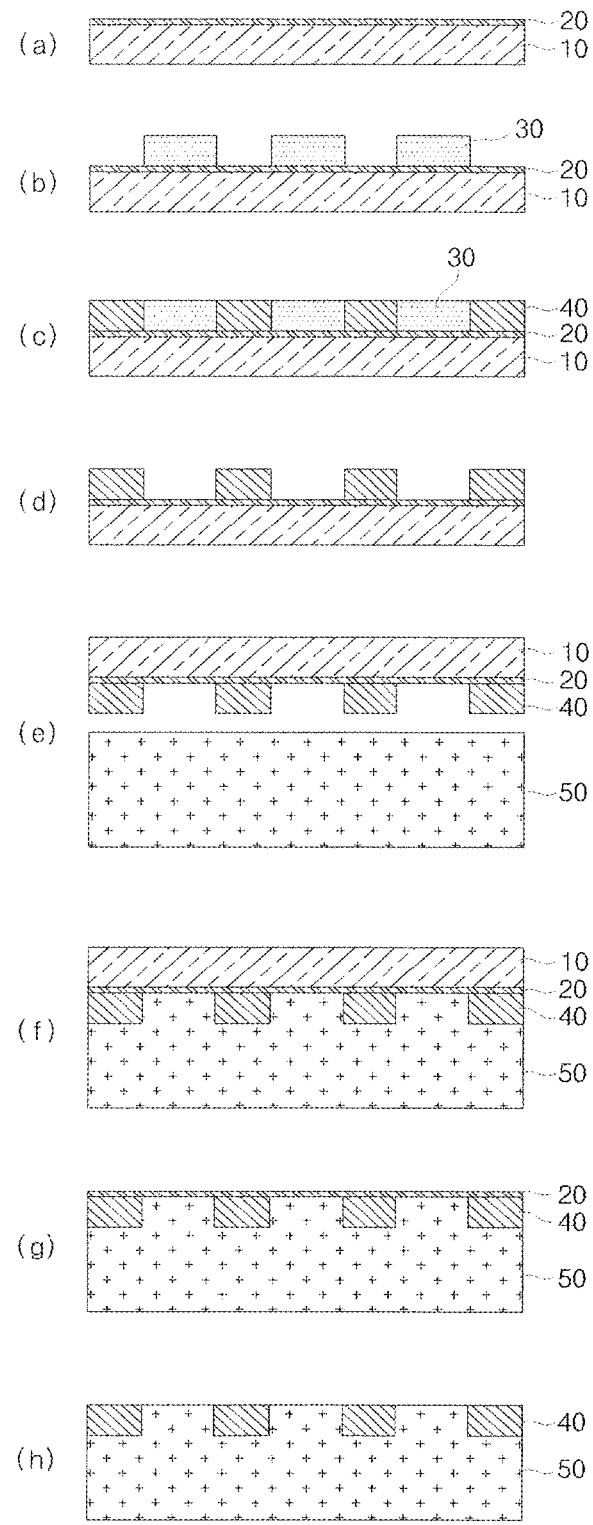

In methods of manufacturing an embedded PCB and a multi-layer PCB using the embedded PCB, the present invention processes photoresist and an insulating layer using a laser to form a circuit pattern so as to simplify a manufacturing process and improve the reliability of accomplished products.

A method of manufacturing an embedded PCB according to the present invention comprises a first step of patterning an insulating layer on which a photoresist layer is formed using a laser such that parts of the insulating layer are selectively etched to form a circuit pattern region and a second step of filling the circuit pattern region with a plating material to form a circuit pattern. The manufacturing method may further comprise a step of removing the photoresist layer.

The present invention will now be described more fully with reference to the accompanying drawings, in which exemplary embodiments of the invention are shown. Like reference numerals in the drawings refer to like elements, and thus their description will be omitted. Though "first" and "second" are used to explain various components, the components are not limited by the terms and the terms are used only to discriminate one component from another component.

Method of Manufacturing Embedded PCB

Figure 4:
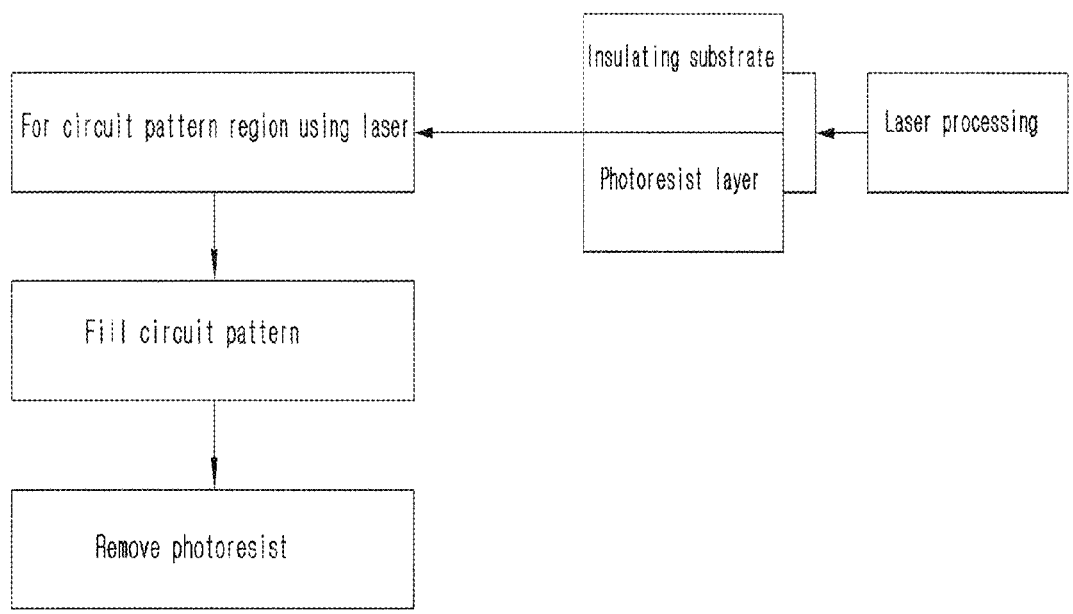
FIGS. 4 and 5 illustrate a method of manufacturing an embedded PCB according to the present invention.
Figure 5:
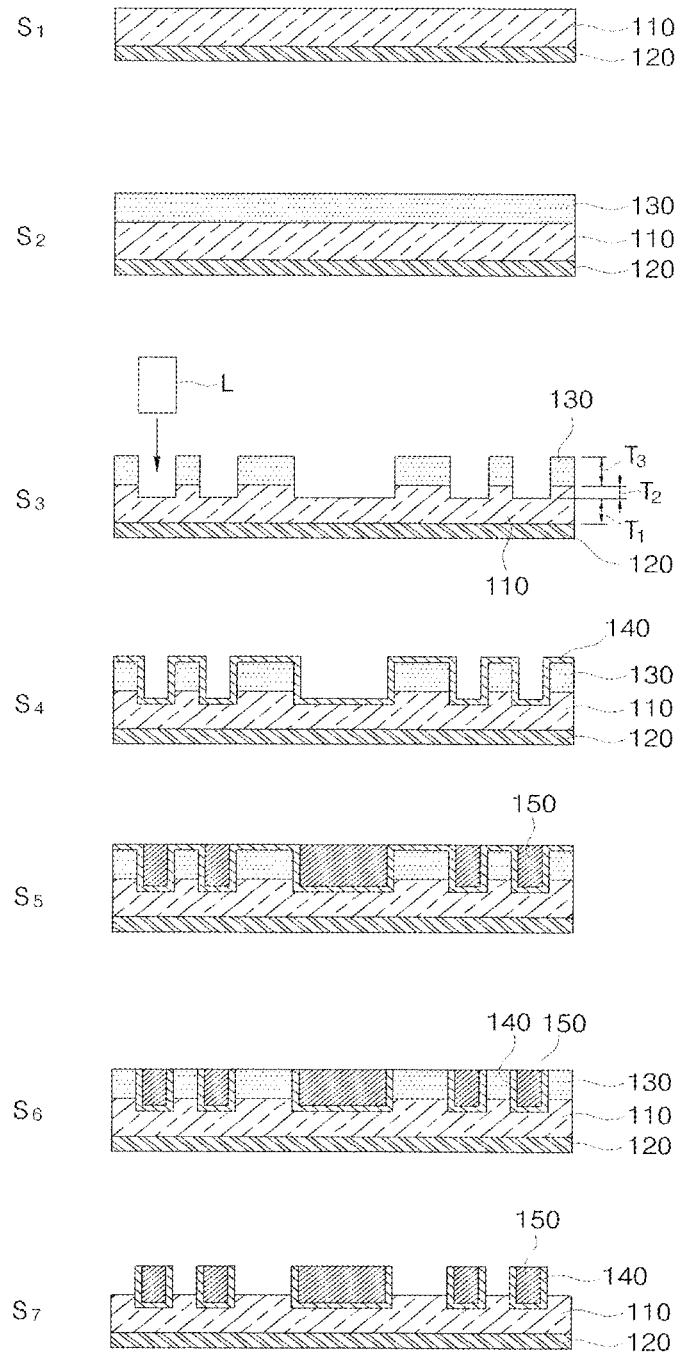

FIGS. 4 and 5 illustrate a method of manufacturing an embedded PCB according to the present invention.

The method of manufacturing an embedded PCB according to the present invention includes a first step of patterning an insulating layer on which a photoresist layer is formed using a laser such that parts of the insulating layer are selectively etched so as to form a circuit pattern region and a second step of filling the circuit pattern region with a plating material to form a circuit pattern. The manufacturing method may further include a step of removing the photoresist layer.

Specifically, a photoresist layer 130 is formed on an insulating layer 110 and a metal layer 120 serving as a carrier layer, in steps S1 and S2 shown in FIG. 5. The photoresist layer 130 may be formed using a coating or lamination method. The photoresist layer 130 and parts of the insulating layer 110 are etched using a laser L to form a circuit pattern region in step S3. That is, the photoresist layer 130 is etched by the entire thickness $T_3$ and the insulating layer 110 is etched by a predetermined thickness $T_2$ to form the circuit pattern region. Parts of the circuit pattern are embedded later in the portion of the insulating layer 100 corresponding to the thickness $T_2$ (Total thickness of the insulating layer=$T_1+T_2$). The photoresist layer 130 and the insulating layer 110 may be sequentially or simultaneously etched using the laser.

A seed layer 140 is formed on the insulating layer 110 and the photoresist layer 130 in which the circuit pattern region is defined in step S4. The seed layer 140 may be formed of one or at least two of Cu, Au, Ni, Pd, In, Ti and Sn, or a conductive polymer. Here, the conductive polymer may be at least one of polyacetylene, polypyrrole, polythiophene, poly(3-alkylthiophene), polyphenylene sulfide, polyphenylenevinylene, polythienylenevinylene, polyphenylene, polyisothianaphthene, polyazulene, polyfuran, and polyaniline. A conductive polymer layer may be formed using a solution containing a monomer of a conductive polymer and an oxidation polymer solution. The monomer of the conductive polymer may use one of acetylene, pyrrole, thiophene, 3-alkylthiophene, phenylene sulfide, phenylene, thienylenevinylene, phenylene, isothianaphthene, azulene, furan, aniline and derivatives of these materials. An organosilane coupling agent may be selectively added to the monomer solution of the conductive polymer.

A metal material is filled in the circuit pattern region on which the seed layer 140 is formed to form a circuit pattern 150 in step S5. The circuit pattern 150 may be formed of at least one of Cu, Ag, Sn, Au, Ni and Pd. The metal material forming the circuit pattern may be filled using one of electroless plating, electroplating, screen printing, sputtering, evaporation, ink jetting and dispensing or a combination of these methods.

The surface of the circuit pattern 150 may be etched through flash etching or grinding in step S6. The surface of the circuit pattern 150 and the seed layer formed on the photoresist layer 130 are etched until the surface of the photoresist layer 130 is exposed.

Subsequently, the photoresist layer 130 is removed to accomplish an embedded PCB in step S7. In the structure of the PCB, the circuit pattern 150 is partially embedded in the portion of the insulating layer 110, which corresponds to the thickness $T_2$. Furthermore, the seed layer 140 is formed on the bottom face and side of the circuit pattern 150 other than the surface of the circuit pattern 150. Here, the boundary of the circuit pattern 150 and the seed layer 140 may be indistinct when the circuit pattern 150 and the seed layer 140 are formed of the same material. The carrier layer 120 is removed later.

Method of Manufacturing Multi-Layer PCB

A method of manufacturing a multi-layer PCB using the aforementioned embedded PCB according to an embodiment of the present invention will now be explained.

Figure 6:
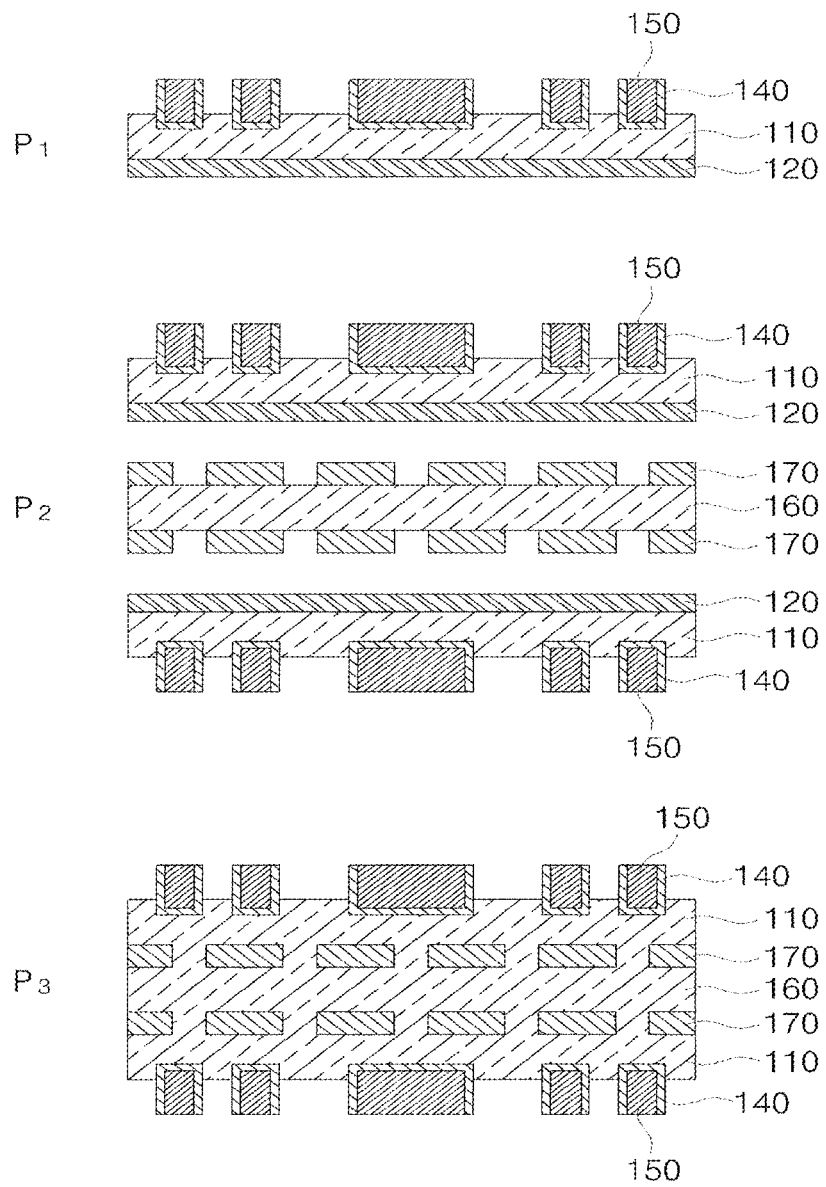
FIG. 6 illustrates a process of manufacturing a multi-layer PCB according to an embodiment of the present invention.

Referring to FIG. 6, the embedded PCB manufactured through steps S1 through S7 shown in FIG. 5 is prepared in step P1. The carrier layer 120 may be removed according to the characteristic of the insulating layer.

An inner circuit board is aligned with the embedded PCB and heat and pressure are applied to the aligned inner circuit board and the embedded PCB to form a multi-layer PCB in steps P2 and P3. The inner circuit board may have a structure in which a predetermined circuit pattern 170 is formed on the top and/or bottom face of an insulating layer 160. In this case, the inner circuit board and the embedded PCB may be pressed against each other such that the insulating layer 110 of the embedded PCB is inserted into recesses formed in the inner circuit board at regions other than the circuit pattern 170.

In the structure of the multi-layer PCB manufactured through the above method, shown in P3 of FIG. 6, the circuit pattern 170 (referred to as a first circuit pattern) is embedded in the insulating layer and the second circuit pattern 150 is formed on the surface of the insulating layer and partially embedded in the insulating layer. Furthermore, the metal seed layer 140 may be formed on the side and bottom face of the second circuit pattern 150 other than the top face of the second circuit pattern 150. Here, the boundary of the second circuit pattern 150 and the metal seed layer 140 may be indistinct if the second circuit pattern 150 and the metal seed layer 140 are formed of the same material. The metal seed layer 140 and the second circuit pattern 150 are formed of the same materials as those of the aforementioned embedded PCB.

Figure 7:
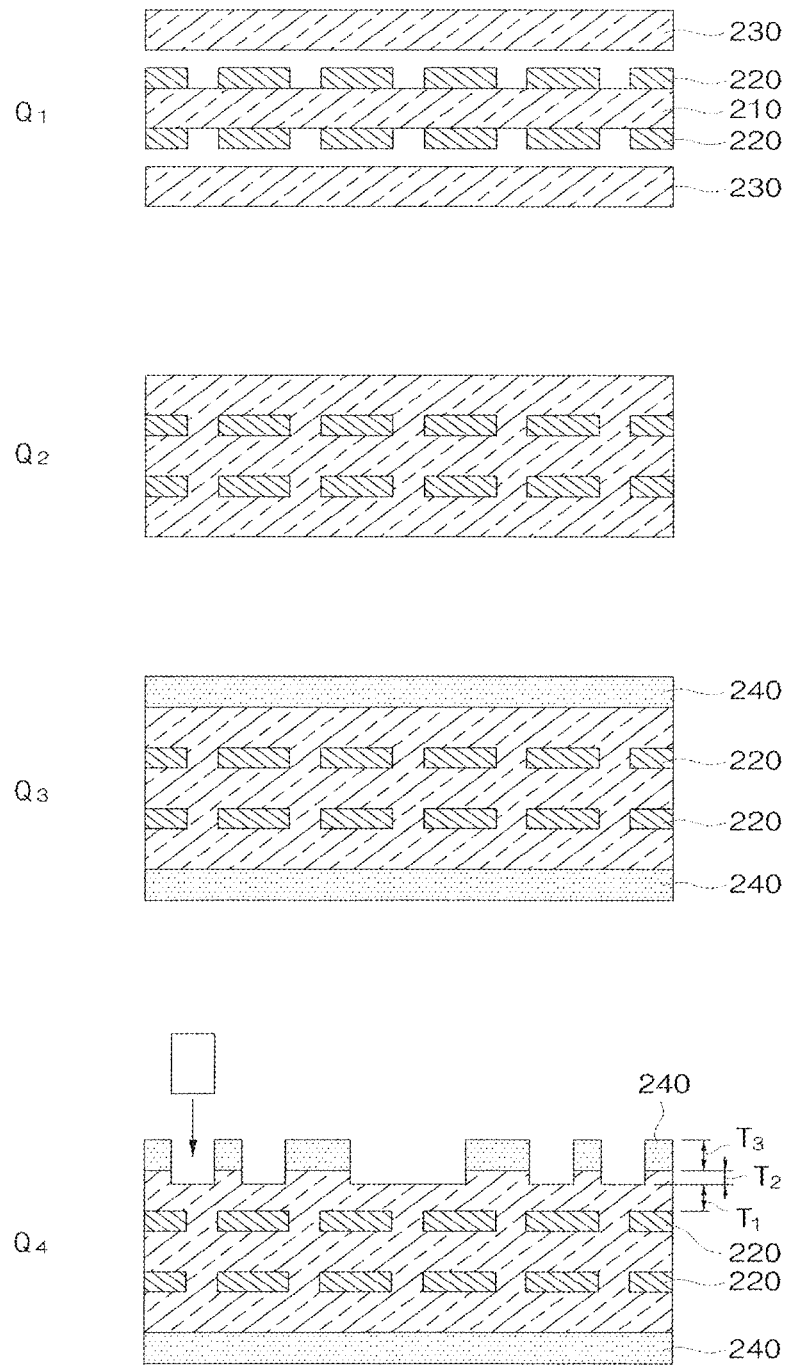
FIGS. 7 and 8 illustrate a process of manufacturing a multi-layer PCB according to another embodiment of the present invention.
Figure 8:
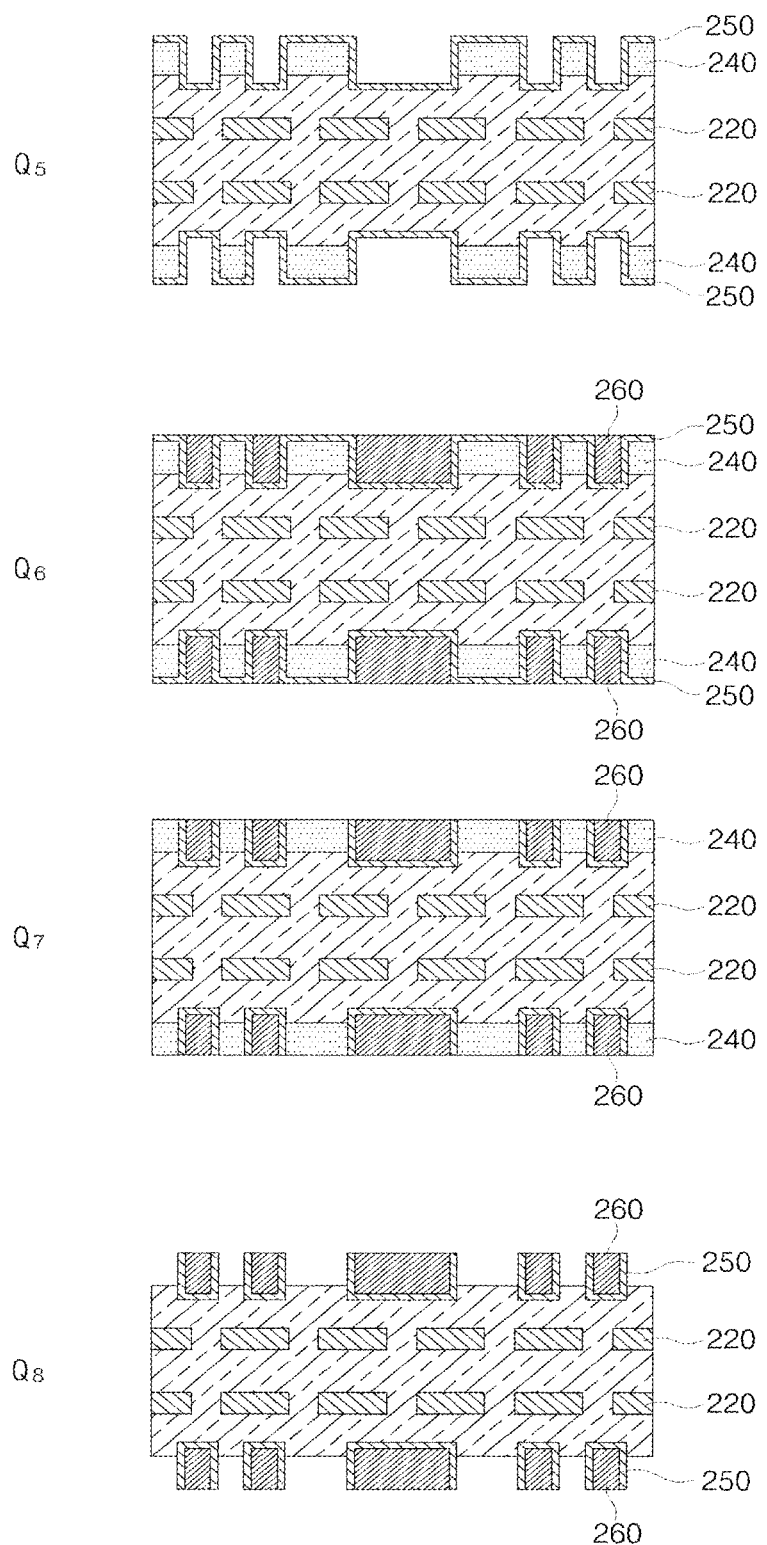

A method of manufacturing a multi-layer PCB according to another embodiment of the present invention will now be explained with reference to FIGS. 7 and 8.

In an embodiment of the invention, the accomplished embedded PCB according to the present invention is not used and an embedded PCB is formed on the top and bottom faces of an inner circuit board through the above embedded PCB manufacturing method.

Specifically, an insulating layer 230 is laminated on the top and bottom faces of an inner circuit board including an insulating layer 210 and a predetermined first circuit pattern 220 formed on the top and bottom faces of the insulating layer 210 in steps Q1 and Q2.

A photoresist layer 240 is formed on the insulating layer 230 in step Q3 and the photoresist layer 240 and the insulating layer 230 are selectively etched using a laser to form a circuit pattern region in step Q4. Here, the photoresist layer 240 is etched by the entire thickness $T_3$ thereof and the insulating layer 230 is etched by a predetermined thickness $T_2$.

A metal seed layer 250 is formed on the circuit pattern region in step Q5. The metal seed layer 250 may be formed of the same material as the above-described seed layer. The circuit pattern region with the metal seed layer 250 formed thereon is filled with a metal material to form a circuit pattern 260 in step Q6. The metal material may be identical to the above-described metal material.

Step Q5 of forming the metal seed layer 250 is essential when the metal material is filled in the circuit pattern region using electroplating in step Q6. However, if the metal material is filled using electroless plating, screen printing, sputtering, evaporation, ink jetting and dispensing in step Q6, step Q6 may be performed after the step Q5 or step Q5 may be omitted.

The top face of the circuit pattern 260 and the filled metal material may be etched through flash etching or grinding in step Q7. Here, the metal seed layer 250 formed on the circuit pattern 260 and the photoresist layer 240 is etched until the surface of the photoresist layer 240 is exposed. Subsequently, the photoresist layer 240 is removed to achieve a multi-layer PCB in step Q8.

The multi-layer PCB manufactured according to the current embodiment may have the same structure as the multi-layer PCB manufactured according to the above embodiment shown in FIG. 6.

While the present invention has been particularly shown in and described with reference to exemplary embodiments thereof, it will be understood by those of ordinary skill in the art that various changes in form and details may be made therein without departing the spirit and scope of the present invention as defined by the following claims.

What is claimed is:

1. A method of manufacturing an embedded printed circuit board (PCB), comprising:
    a first step of laser-patterning an insulating layer and a photoresist layer laminated on the insulating layer together to form a circuit pattern region in which a part of the insulating layer is etched;
    a second step of forming a metal seed layer on the insulating layer on which the circuit pattern region is formed, and filling the circuit pattern region with a metal material;
    a third step of removing the metal seed layer from a top face of a circuit pattern so that the metal seed layer is formed on the remaining surface except for the top face of the circuit pattern, thereby forming a first printed circuit board; and
    a fourth step of disposing the first printed circuit board on a first surface of an inner circuit board,
    wherein the method further comprises: forming a second printed circuit board by the first through third steps; and disposing the second printed circuit board on a second surface of the inner circuit board opposite to the first surface.

2. The method of claim 1, wherein the metal seed layer is formed of one or more of Cu, Au, Ni, Pd, In, Ti, Sn, and a conductive polymer.

3. The method of claim 1, wherein the metal material includes at least one of Cu, Ag, Sn, Au, Ni and Pd.

4. The method of claim 1, wherein the circuit pattern region is filled with the metal material using electroless plating, electroplating, screen printing, sputtering, evaporation, ink jetting, dispensing, or a combination thereof.

5. The method of claim 1, wherein the insulating layer is composed of a carrier layer and an insulating member formed thereon.

\* \* \* \* \*